United States Patent [19]
Hsu

[11] Patent Number: 5,960,290
[45] Date of Patent: Sep. 28, 1999

[54] METHOD FOR FABRICATING A PROTECTION CIRCUIT OF ELECTROSTATIC DISCHARGE ON A FIELD DEVICE

[75] Inventor: Chen-Chung Hsu, Taichung, Taiwan

[73] Assignee: United Microelectronics Corp., Hsinchu, Taiwan

[21] Appl. No.: 09/183,029

[22] Filed: Oct. 29, 1998

[51] Int. Cl.$^6$ .............................................. H01L 21/336
[52] U.S. Cl. ........................ 438/281; 438/289; 438/586
[58] Field of Search .................................. 438/281, 289, 438/586, FOR 193, FOR 196, FOR 204, FOR 205; 257/361

[56] References Cited

U.S. PATENT DOCUMENTS

| | | |
|---|---|---|
| 4,602,267 | 7/1986 | Shirato . |
| 5,371,395 | 12/1994 | Hawkins . |
| 5,885,875 | 3/1999 | Hsu . |
| 5,895,958 | 4/1999 | Miki . |

*Primary Examiner*—George Fourson
*Attorney, Agent, or Firm*—Hickman Stephens & Coleman

[57] ABSTRACT

A method for fabricating a protection circuit for electrostatic-discharge (ESD) with an improved field device transistor includes connecting the source of the improved transistor to a ground voltage source, and connecting both the gate and the drain of the improved transistor to an I/O port and an internal circuit, which is to be protected from ESD problems. The method includes forming a gate region on a semiconductor substrate. A spacer is formed on one side of the gate region. An ion implantation process is performed to partially dope the gate region. A field oxide layer serving as a gate oxide layer is formed on the substrate within the gate region. After remove the spacer, a source region and a drain region are formed in the substrate by ion implantation. A dielectric layer is formed over the substrate with one source contact opening to expose the source region and one drain contact opening to expose the drain region. A metal layer is formed over the substrate but is separated into two parts. One part fills the source contact opening to form the source, and the other part fills the drain contact opening to form the drain and covers the field oxide layer to serve as the gate.

9 Claims, 3 Drawing Sheets

METHOD FOR FABRICATING A PROTECTION CIRCUIT OF ELECTROSTATIC DISCHARGE ON A FIELD DEVICE

BACKGROUND OF THE INVENTION

1. Field of the Invention

This invention relates to a method for fabricating an electrostatic-discharge (ESD) protection circuit using a field device, and more particularly to forming a field device with a low threshold voltage in an ESD protection circuit.

2. Description of Related Art

In the fabrication of an integrated circuit (IC), electrostatic-discharge (ESD) is one of the main factors causing IC damage. In order to solve ESD problems, an on-chip ESD protection circuit is fabricated directly on a bonding pad of, for example, a complementary metal-oxide semiconductor (CMOS) device. However, the ESD protection circuit is no longer effective protection because the threshold voltage of the IC device is reduced when the IC device is fabricated at a deep submicron or smaller dimension. The problems induced by ESD cause IC device failure. Hence, how the efficiency of an ESD protection circuit can be increased is an important issue for IC manufactures.

FIG. 1 is a circuit schematically illustrating a conventional ESD protection circuit, using a field effect transistor. In FIG. 1, an N-type field device is illustrated. Electrostatic charges from an input/output (I/O) port are discharged through a field device 10, such as a field device transistor, since the field device 10 is grounded to a ground voltage source Vss, in which the electrostatic charges also induce an over-stress voltage. The over-stress voltage passes a buffer gate 12 and into an internal circuit 14. The field device 10 therefore serves as an ESD element to protect the internal circuit 14 from the electrostatic charges induced by the I/O port, such as a bonding pad.

FIG. 2 is a cross-sectional view of a conventional field device transistor shown in FIG. 1. In FIG. 2, the field device transistor 10 of FIG. 1 is formed on a semiconductor substrate 20. The conventional field device transistor includes a field oxide layer 24 formed between a source region 22 and a drain region 23. For an N-type field device transistor, a P-type doped region 26 is conventionally formed below the field oxide layer 24. Then, the source region 22 is extended by an interconnect metal layer 27 to form a transistor source S, which is to be coupled to a ground voltage source Vss (FIG. 1). The interconnect metal layer 27 also extends the drain region 23 out to form a transistor drain D. Since the gate and the drain are directly coupled together, as shown in FIG. 1, the interconnect metal layer 27 also covers the field oxide layer 24 to effectively form a transistor gate G. The interconnect metal layer 27 is held by a dielectric layer 28.

For the conventional field device transistor 10 described above, when the over-stress voltage is inputted from the I/P port to the field device transistor 10, it activates the field device transistor 10 by a punch-through effect. Using the punch-through effect to activate the field device transistor 10 is faster than using the junction breakdown effect. The faster speed enables the field device transistor to prevent a gate oxide breakdown of a transistor in the internal circuit 14 at a low voltage from occurring due to the over-stress voltage.

However, in semiconductor fabrication, a P-type doped region is usually formed below a field oxide layer to increase isolation between device elements so that a P-type doped region 26 is also formed below the field oxide layer 24 in the field device transistor 10. This causes the field device transistor 10 to have a threshold voltage $V_T$ of about 12V–14V. The threshold voltage is the minimum voltage on the gate G necessary to activate the transistor 10. The threshold voltage $V_T$ of the field device transistor 10 thereby is greater than a breakdown voltage of a usual transistor. For example, the usual transistor, belonging to the internal circuit 14 and including its gate oxide layer with a thickness of about 50 Å, has a breakdown voltage of about 5V–6V. Hence, the field device transistor 10 with high $V_T$ of about 12V–14V is not suitable protection for the usual transistor with its gate oxide thickness of about 50 Å in the internal circuit 14.

SUMMARY OF THE INVENTION

It is therefore an objective of the present invention to provide a method for fabricating an ESD protection circuit with an improved field device, which uses a punch-through effect to activate a field device with a low threshold voltage. In order to achieve this objective, a doped region is further formed below a field oxide layer with a type opposite to the substrate type. An N-type doped region, for example, is formed if the substrate is, for example, P-type. The N-type doped region also reduces the channel length below the field oxide layer so that circuit response is increased. The ESD protection therefore can effectively protect an internal circuit from ESD problems.

In accordance with the foregoing and other objectives of the present invention, a structure of an ESD protection circuit with an improved field device is provided. The structure includes a field device transistor formed on a semiconductor substrate and coupled to an I/O port with an internal circuit in between. The field device transistor includes a field oxide layer servicing as a gate oxide layer in a typical field effect transistor, and an interchangeable source/drain region in the substrate on each side of the field oxide layer. A doped region is formed below the field oxide layer and contacts one of the interchangeable source/drain regions, in which the contacted region serves as a source region and the other one serves as a drain region. A channel length is thereby formed between the doped region and the drain region. The channel length is properly set to determine the desired threshold voltage of the field device transistor. An interconnect metal layer held by a dielectric layer is formed over the substrate to extend the source region, the drain region, and a gate out like the usual field effect transistor, in which the interconnect metal layer has to cover the field oxide layer to serve as the gate. The source is individually coupled to a ground voltage source Vss through the interconnect metal layer. The gate and the drain are coupled together to form a conductive body that is also electrically coupled to the internal circuit and the I/P port. The internal circuit is the one to be protected by the field device transistor, and the I/P port carries electrostatic charges. Since the dopant types of the source, the drain, and the doped region below the field oxide layer are the same and form a smaller channel length, the response of the punch-through effect is faster, and the threshold voltage is reduced.

In accordance with the foregoing and other objectives of the present invention, a method for fabricating an ESD protection circuit with an improved field device is provided. The method includes a field device transistor formed over a semiconductor substrate to have couplings with an I/O port and an internal circuit to protect the internal circuit. First, a pad oxide layer 31 and a silicon nitride layer are sequentially formed over the substrate. A portion of the silicon nitride layer is removed by, for example, photolithography and etching to expose a portion of the pad oxide layer. The exposed region is the gate region where a field oxide layer is to be formed. The field oxide layer serves as a gate oxide layer in a usual field effect transistor. A spacer is formed on one side of the silicon nitride layer within the gate region. Using the silicon nitride layer and the spacer as a mask, an ion implantation process is performed to dope a doped region in the gate region. The doped region is opposite in type to the semiconductor substrate. The purpose of the doped region is to reduce a threshold voltage of the field device transistor. Then, a field oxide layer is formed on the substrate within the exposed pad oxide region. Next, the spacer, the silicon nitride layer, and the pad oxide layer are removed. An ion implantation process is performed to form a source region and a drain region, which have the same dopant type as that of the doped region within the gate region. The doped region is electrically coupled to the source region. The distance between the doped region and the drain region is the channel length, which determines the threshold voltage of the field device transistor. A dielectric layer with two contact openings is formed over the substrate, in which one contact opening exposes the source region and the other contact opening exposes the drain region. An interconnect metal layer is formed over the substrate with two separate parts so that the source region is separately extended out through the source contact opening to form a source, and the drain region is separately extended out through the drain contact opening to form a drain. The interconnect metal layer also covers the field oxide layer to serve as a gate of the field device transistor so that the drain and the gate are coupled together. The source is coupled to a ground voltage source Vss, and both the gate and the drain are coupled to the I/O port and the internal circuit. The ESD protection circuit with the improved field device transistor is thereby formed to protect the internal circuit from the I/O port, which carries electrostatic charges. The electrostatic charges are discharged through the field device transistor, which has a faster punch-through effect response and lower threshold voltage $V_T$.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1:
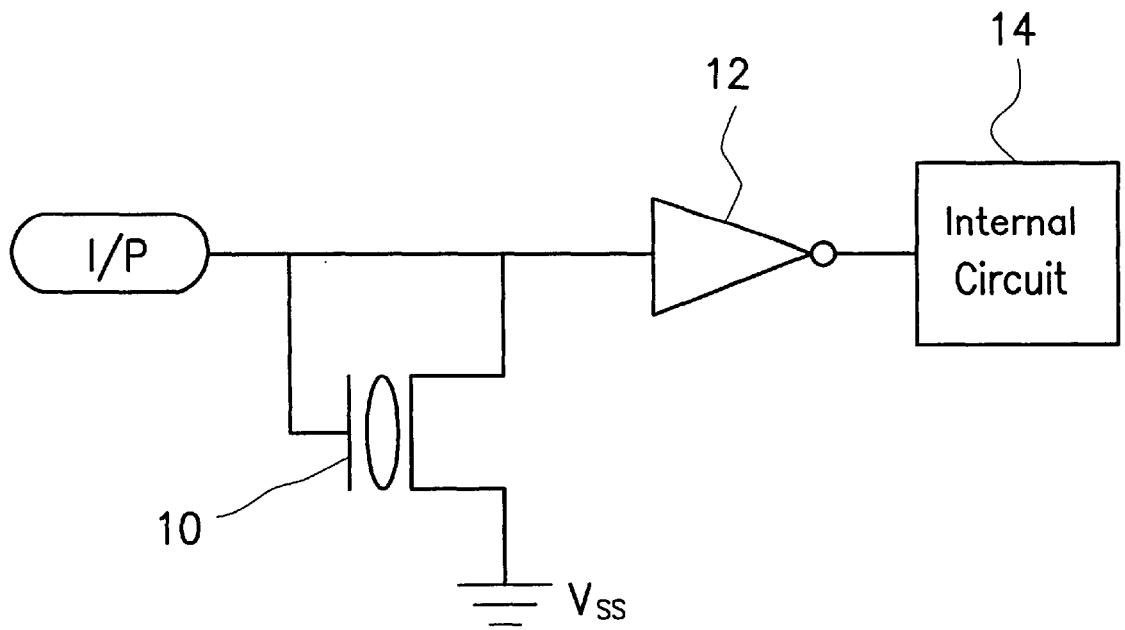
FIG. 1 is a circuit schematically illustrating a conventional ESD protection circuit, using a field effect transistor.
Figure 2:
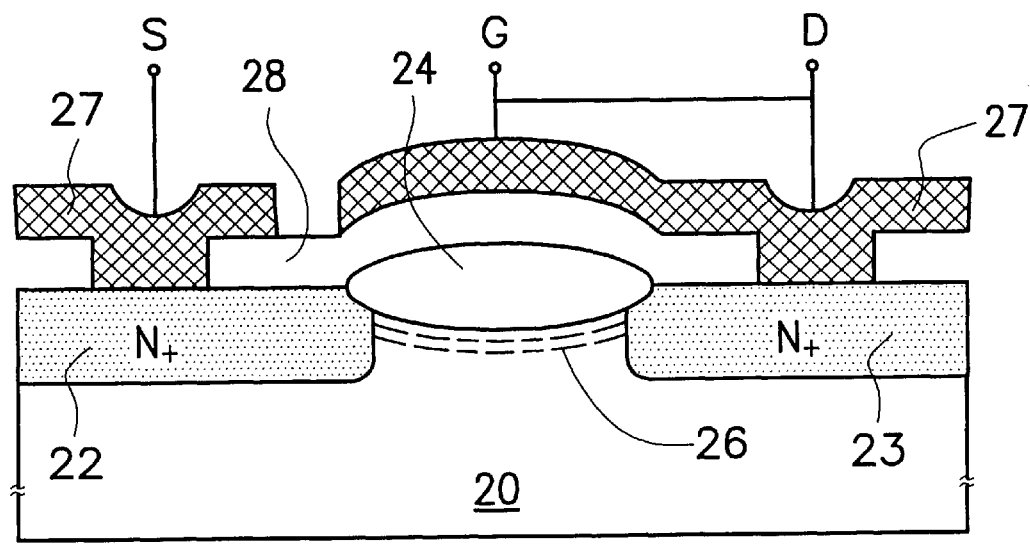
FIG. 2 is a cross-sectional view of a conventional field device transistor shown in FIG. 1.

In FIG. 1, the field device transistor 10 is used for ESD protection. As punch-through occurs, threshold voltage $V_T$ of the field device transistor 10 is necessarily less than breakdown voltage of the buffer gate 12, which as a typical breakdown voltage of about 6V. This ensures that the buffer gate 12 does not breakdown to cause damage to the internal circuit 14. However, a typical working voltage is less than about 3.3 V for a semiconductor device at deep submicron dimension level. In order to actually protect the internal circuit from EDS problems, the threshold voltage of the field device transistor 10 is necessarily greater than the working voltage of the buffer gate 12. Then, when the over-stress voltage is greater than the working voltage, the field device transistor 10 can effectively discharge the electrostatic charges to protect the internal circuit 14. An ideal range of $V_T$ of the field device transistor 10 is about between 3.3V and 6V.

Figure 3A:
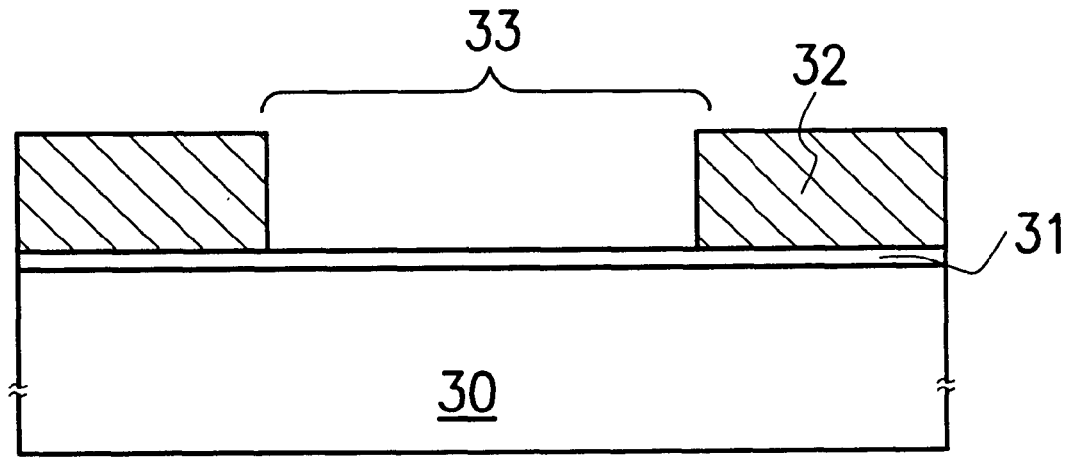
FIGS. 3A–3D are cross-sectional views of an improved field device transistor schematically illustrating a fabrication process, according to a preferred embodiment of the invention.

FIGS. 3A–3D are cross-sectional views of an improved field device transistor schematically illustrating a fabrication process according to a preferred embodiment of the invention. In FIG. 3A, a P-type semiconductor substrate 30, for example, is provided. An N-type field device transistor, for example, is then to be formed over the substrate 30. The type of field device transistor is opposite to the type of the substrate 30. A pad oxide layer 31 and a silicon nitride layer (not shown) are sequentially formed over the substrate 30. The silicon nitride layer is patterned to form an opening, which exposes a portion of the pad oxide layer 31. The silicon nitride layer becomes a silicon nitride layer 32. The exposed region of the pad oxide 31 is called a gate region 33 where a field oxide layer serving as a gate oxide layer is to be formed later.

Figure 3B:
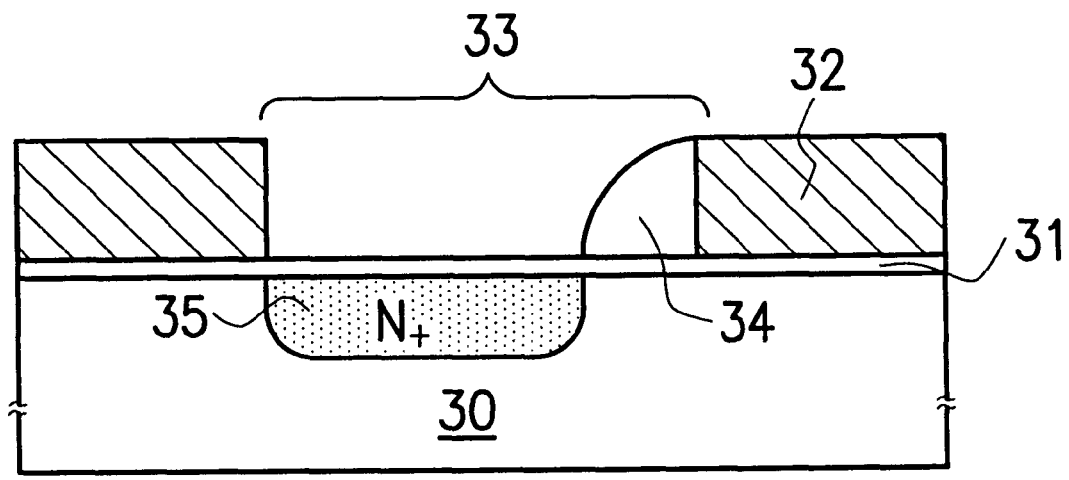

In FIG. 3B, a spacer 34 is formed on one side wall of the silicon nitride layer 32 within the gate region 33 by, for example, depositing an oxide layer (not shown) over the substrate 30, and performing an etching back process to remove the oxide layer. The residue of the oxide layer forms a spacer on each side of the opening within the gate region 33. One side of the spacer is removed by, for example, performing etching again, so that the remaining spacer 34 is left. Next, using the silicon nitride layer 32 and the spacer 34 as a mask, an ion implantation process is performed to form a doped region 35 in the substrate 30 within the gate region 33. The doped region is an N-typed doped region, which is opposite in type to the type of the substrate 30. The spacer 34 is used to adjust a channel length of the field device transistor, as can be seen in subsequent processes.

Figure 3C:
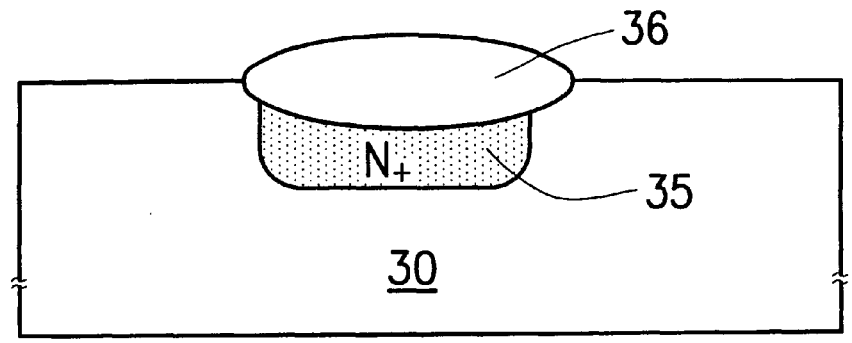

In FIG. 3C, a field oxide layer 36 is formed by, for example, thermal oxidation. Then, the pad oxide layer 31, the silicon nitride layer 32, and the spacer 34 are removed by, for example, conventional wet etching, as is familiar to the one skilled in art. The doped region 35 is below part of the field oxide layer 36.

Figure 3D:
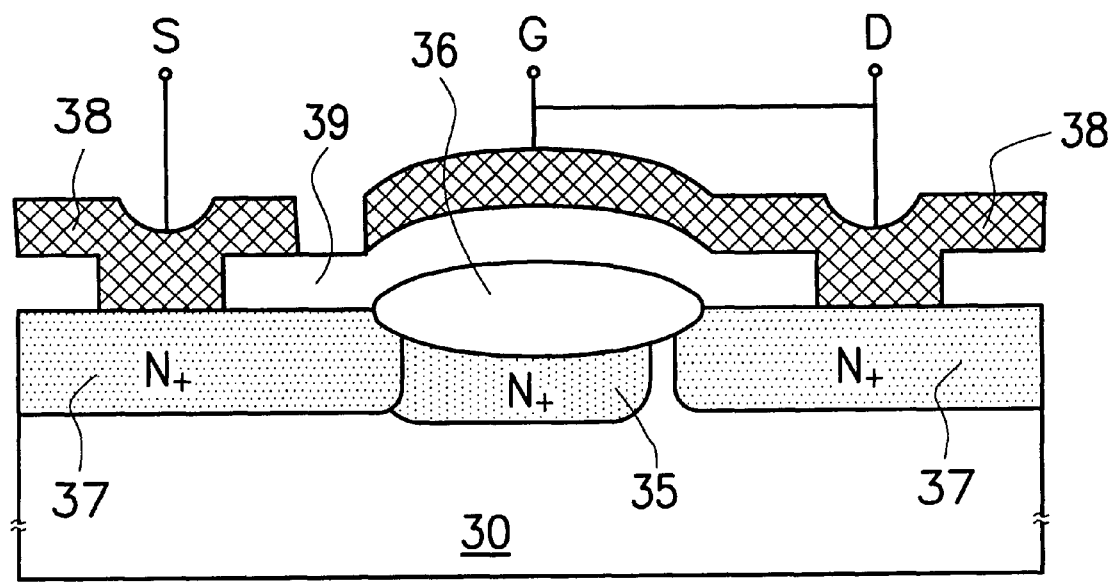

In FIG. 3D, an interchangeable source/drain region 37 is formed in the substrate 30 through, for example, ion implantation with a dopant type opposite to the type of the substrate 30. The one interchangeable source/drain region 37 electrically coupled to the doped region 35 is the source region, and the other one is the drain region. The distance between the doped region 35 and the drain region is the channel length. The remaining fabrication processes are conventional. A dielectric layer with two contact openings is formed over the substrate 30, in which one contact opening exposes the source region, and the other contact opening exposes the drain region. An interconnect metal layer 38 is formed over the substrate 30 but is separated into two parts by, for example, photolithography and etching. One part of the interconnect metal layer 38 fills the source contact opening to form a source S. The other part of the interconnect metal layer 38 fills the drain contact opening to form a drain D and a gate G. Since it is necessary to couple the gate G and the drain D together as shown in FIG. 1, the portion of the interconnect metal layer 38 covering the field oxide layer 36 serves as the gate G. Then, also referring to FIG. 1, the source S is coupled to a ground voltage source Vss and both the gate G and the drain D are coupled to the I/O port and the internal circuit 14. The ESD protection circuit with the improved field device transistor is formed.

The over-stress voltage from the I/O port to the internal circuit 14 is protect by the improved field device transistor for discharging electrostatic charges. Since the channel length is reduced through the formation of the doped region 35, the $V_T$ is less than 6 V, which allows a protection on a field effect transistor even with, for example, a thickness of about 50 Å on its gate oxide layer. The N-type doped region 35 allows a faster response of the field device transistor because it makes the punch-through effect occur easily.

In conclusion, the improved field device transistor has characteristics as follows:

1. The N-type doped region 35 formed below the field oxide layer 36 reduces the channel length to allow a faster response of the field device transistor because it makes the punch-through effect occur easily.

2. The channel length of the improved field device transistor between the doped region 35 and the drain region of the interchangeable source/drain region 37 is arranged by making use of the spacer 34. This results in a proper $V_T$ range to effectively protect the internal circuit 14.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating an improved field device used in a protection circuit of electrostatic-discharge (ESD), the field device being coupled to an input/output (I/P) port and an internal circuit, which is to be protected from ESD problems, the method comprising:

sequentially forming a pad oxide layer and a silicon nitride layer over a semiconductor substrate;

removing a portion of the silicon nitride layer to expose the pad oxide layer, wherein the removed portion forms a gate region;

forming a first spacer on one side-wall of the silicon nitride layer within the gate region;

implanting ions to form a doped region, using the silicon nitride layer and the first spacer as a mask;

forming a field oxide layer on the substrate within the gate region;

removing the silicon nitride layer, the first spacer, and the pad oxide layer;

implanting ions into the substrate to form a source region and a drain region, wherein the source abuts the doped region, and the drain region has a distance to the doped region;

forming a gate over the field oxide layer;

forming a first conductive layer, which allows the source region to be electrically coupled to a discharging voltage source; and forming a second conductive layer, which allows the drain region to be electrically coupled to the gate and allows both the gate and the drain region to be electrically coupled to the I/O port and the internal circuit, wherein the source region, the drain region, and the doped region have the same dopant type, which is opposite to the type of the substrate.

2. The method of claim 1, wherein the formation of the gate, the first conductive layer and the second conductive layer comprises:

forming a dielectric layer over the substrate with a first opening to expose the source region and a second opening to expose the drain region;

forming an interconnect metal layer over the substrate, wherein the first opening and the second opening are also filled by the interconnect metal layer; and patterning the interconnect metal layer to separate the interconnect metal layer into two parts to form the first conductive layer and the second conductive layer, in which the first conductive layer fills the first contact opening, and the second conductive layer fills the second contact opening and covers the field oxide layer to automatically serve as the gate.

3. The method of claim 1, wherein the step of forming first spacer further comprises:

depositing an oxide layer over the substrate;

performing an etching back process to remove the oxide layer, in which the residual oxide layer on each sidewall of the silicon nitride layer within the gate region forms two spacers; and removing one of the spacers, of which the remaining spacer is the first spacer.

4. The method of claim 1, wherein the field device is a field device transistor and is coupled with the I/O port and the internal circuit in between to protect the internal circuit from ESD problems.

5. The method of claim 1, wherein the field device comprises an N-type field device transistor.

6. The method of claim 5, wherein the source region is coupled to a ground voltage source through the first conductive layer, in which the ground voltage source is the discharging voltage source.

7. The method of claim 5, wherein the doped region is N-type doped.

8. The method of claim 1, wherein the doped region is used to reduce the channel length to increase the response speed of punch-through.

9. The structure of claim 1, wherein the doped region is used to reduce the channel length to decrease the threshold voltage of the field device transistor.

* * * * *